United States Patent [19]

Iizuka

[11] Patent Number: 4,698,789
[45] Date of Patent: Oct. 6, 1987

[54] MOS SEMICONDUCTOR DEVICE

[75] Inventor: Tetsuya Iizuka, Funabashi, Japan

[73] Assignee: Kabushiki Kaisha Toshiba, Kawasaki, Japan

[21] Appl. No.: 800,301

[22] Filed: Nov. 21, 1985

[30] Foreign Application Priority Data

Nov. 30, 1984 [JP] Japan .................................. 59-253003
Nov. 30, 1984 [JP] Japan .................................. 59-253004

[51] Int. Cl.$^4$ .............................................. G11C 11/40
[52] U.S. Cl. ..................................... 365/226; 307/297
[58] Field of Search ................ 307/297, 304; 365/226, 365/228, 229, 227; 323/314, 315, 316

[56] References Cited

U.S. PATENT DOCUMENTS 4,260,909  4/1981  Dumbri et al. ...................... 307/297
4,585,955  4/1986  Uchida ................................ 307/297

OTHER PUBLICATIONS

Itoh et al., "An Experimental 1MB DRAM with On--Chip Voltage Limiter," IEEE International Solid-State Circuits Conference, pp. 282, 283, Feb. 24, 1984.

Primary Examiner—Joseph A. Popek
Attorney, Agent, or Firm—Finnegan, Henderson, Farabow, Garrett & Dunner

[57] ABSTRACT

An MOS semiconductor device comprises a MOS operation circuit including a plurality of MOS transistors each with a reduced channel length and an operation voltage setting circuit for supplying an operation voltage lower than the power source voltage between the first and second operation voltage receiving terminals. The back gates of the MOS transistors in the MOS operation circuit are connected to a power source terminal or ground. The operation voltage setting circuit is inserted between the MOS operation circuit and either the power source terminal or ground and develops a voltage drop in accordance with the operating current flowing through the MOS operation circuit.

12 Claims, 14 Drawing Figures

MOS SEMICONDUCTOR DEVICE

BACKGROUND OF THE INVENTION

The present invention relates to an MOS semiconductor device including MOS transistors whose effective channel length is 1 μm or less, for example.

The development of MOS semiconductor devices has progressed remarkably. In the latter half of 1960s, the number of MOS transistors that could be integrated into one semiconductor chip was several hundred at most, with the effective channel length being approximately 10 μm. Since, then, the microfabrication technology and high density integration technology have significantly advanced so that it is possible to form hundreds of thousand of MS transistors having a channel length of 1.5 μm on a single chip. Further, semiconductor devices which are operable at a high speed with low power consumption can be realized by forming MOS transistors having a channel length of 1 μm or less and at a high density.

The conventional MOS transistor circuit employs an external power source for driving the internal circuit. The voltage of the power source must be reduced the shorter the effective channel length becomes of MOS transistors contained in the internal circuit to be driven. To drive an MOS transistor with an effective channel length of 1.5 μm, for example, a single power source is used and its output voltage is approximately 5 V. To drive a MOS transistor with an effective channel of 1.0 μm, a lower power source voltage than 5 V should be used. If a voltage of 5 V is applied to a MOS transistor having a channel length of 1.0 μm, an intense electric field is developed in the channel region of the MOS transistor. High energy carriers are trapped in the insulating oxide film, causing possible deterioration in the operating characteristics of the MOS transistor.

Figure 1:
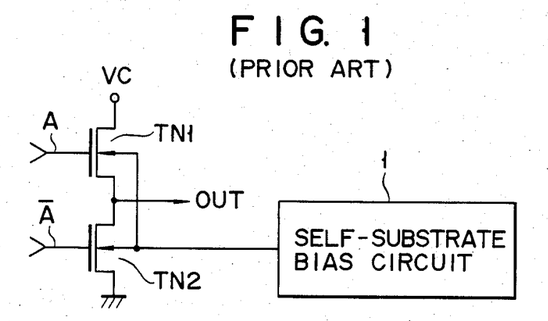
FIG. 1 is a conventional MOS semiconductor device with a self-substrate bias circuit.

In the conventional MOS semiconductor device have been unsatisfactory for preventing, for example, a leak current from flowing while a voltage lower than the threshold voltage is being applied, a voltage applied to the source or drain diffusion layer from undershooting, and the formation of junction capacitance associated with the diffusion layers. In the case of a semiconductor device which includes two n-channel MOS transistors TN1 and TN2, as shown in FIG. 1, a self-substrate bias circuit 1 has been provided for setting the back gates of the transistors TN1 and TN2 at a lower potential than the ground potential, thereby inversely biasing th junction between the source or drain diffusion layer and the substrate. This approach, however, requires the generation of a negative bias voltage from the self-substrate bias circuit 1 even when the integrated circuit is in a standby mode, increasing power consumption of the device as a result of the self-substrate bias circuit 1.

In order to apply a negative bias voltage to the back gates of the n-channel MOS transistors, CMOS devices have been considered. When a CMOS device is used a self-substrate bias circuit of high impedance is provided between the emitter and base of an npn transistor constituted by the source or drain diffusion region of the n-channel MOS transistor, the p-well, and an n-type substrate in the CMOS device. This arrangement makes the latch-up phenomenon peculiar to CMOS devices a serious problem.

SUMMARY OF THE INVENTION

Accordingly, an object of the present invention is to provide a MOS semiconductor device which contains MOS transistors having short channels and which is operable with high reliability.

To achieve the above object, there is provided a MOS semiconductor device comprising first and second power source terminals connected to receive a power source voltage, an MOS circuit including a plurality of MOS transistors whose back gates are coupled with the first or second power source terminal, and having first and second operation voltage receiving terminals respectively coupled with the first and second power source terminals, an operation voltage setting circuit coupled between one of the first and second power source terminals and the MOS circuit, the operation voltage setting circuit developing a voltage drop by an operation current flowing through the MOS circuit, and causing a voltage obtained by subtracting the voltage drop from the power source voltage to be applied to the MOS circuit.

With such an arrangement, the MOS transistors in the MOS circuit are driven by a lower voltage than the power source voltage. Accordingly, the effective channel length of each MOS transistor can be reduced. Since the back gates of these transistors are coupled with the first or second power source terminal, even in the standby mode, a reverse bias voltage is applied between the substrate and the active impurity region such as the drain or source region so that the leak current in these MOS transistors can be minimized.

DETAILED DESCRIPTION OF THE PREFERRED EMBODIMENTS

Figure 2:
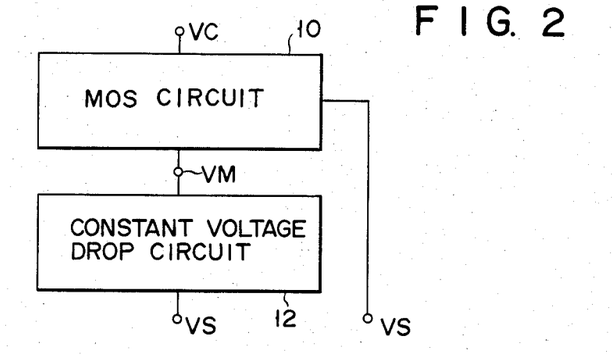
FIG. 2 is a block diagram of a MOS semiconductor device according to an embodiment of the present invention.

Reference is made of FIG. 2 which illustrates an MOS semiconductor device according to an embodiment of the present invention. The semiconductor device includes a MOS operation circuit 10 having MOS transistors with an effective channel length of 1 μm or less and a constant voltage drop circuit 12. These circuits 10 and 12 are fabricated on the same semiconductor chip. The circuit 12 is used for setting the operating voltage of the operation circuit 10. The circuit 10 is connected at the high voltage terminal to an external power source terminal VC, and at the lower voltage terminal VM to a ground terminal VS via the constant-voltage-drop circuit 12. The back gates of n-channel MOS transistors (not shown) are connected to the ground terminal VS.

Figure 3:
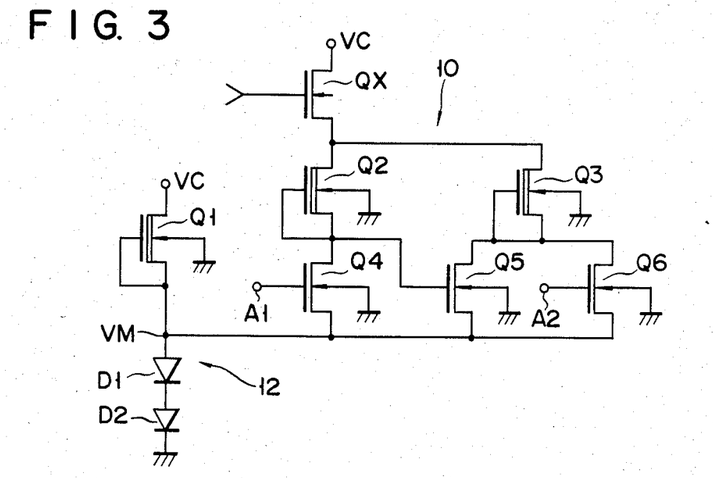
FIG. 3 is a circuit diagram of the semiconductor device shown in FIG. 2.

FIG. 3 shows in detail a circuit arrangement of the MOS semiconductor device shown in FIG. 2. The constant-voltage-drop circuit 12 contains a depletion type n-channel MOS transistor Q1 whose drain is connected to the power source terminal VC, and whose source and gate are connected to each other and grounded through a series of diodes D1 and D2. The output voltage of the constant voltage drop circuit 12 is derived from the junction VM between the MOS transistor Q1 and the diode D1. The output voltage-operating current characteristic of this circuit 12 is indicated by a solid line in FIG. 4. As seen from the characteristic curve, a change in the voltage is much smaller than that in the current.

The MOS circuit 10 includes n-channel MOS transistors QX and Q2 to Q6. The MOS transistor QX is turned on in a standby mode of the operation circuit 10. The transistors Q2 and Q3 are of the depletion type, while the transistors Q4 to Q6 are of the enhancement type. The MOS transistors Q2 and Q3 are connected at the drains to the power source terminal VC through the MOS transistor QX. The transistor Q4 is connected at the gate to a first input terminal A1, and at the drain to the source and gate of the MOS transistor Q2. The transistor Q5 is connected at the gate to the source and gate of the transistor Q2. The gate of the transistor Q6 is connected to another input terminal A2. The drains of the MOS transistors Q5 and Q6 are commonly coupled with the source and gate of the MOS transistor Q3. The sources of the transistors Q4 to Q6 are connected together to the output terminal VM of the constant voltage drop circuit 12. The back gates of these MOS transistors Q2 to Q6 are grounded. The transistors QX, Q2 to Q6 each have the channel length of 1 μm, for example.

The operating current flowing through the MOS operation circuit 10 changes within a range defined by maximum and minimum operating current characteristic curves respectively indicated by broken lines BL1 and BL2. The graph of FIG. 4 teaches the fact that, when the current flowing through the circuit 10 changes, the resultant variation of the voltage at the output terminal VM is confined to a narrow range between the maximum and minimum voltages VM1 and VM2. Little operating current flows when the MOS circuit 10 is in the standly mode. Even in such a case, current constantly flows into the diodes D1 and D2 through the MOS transistor Q1 which has a relatively long effective channel, and therefore the potential at the terminal VM is kept at the approximately constant level VM2. In this circuit, the current flowing through the MOS transistor Q1 and the diodes D1 and D2 can be reduced to a satisfactorily small value by appropriately selecting the effective channel length of the MOS transistor Q1. If that current is properly selected, a negative substrate bias voltage (potential at the back gate with respect to the source) is supplied to the transistors Q2 to Q6, through the ground terminal VS, immediately after the power source is turned on.

Figure 4:
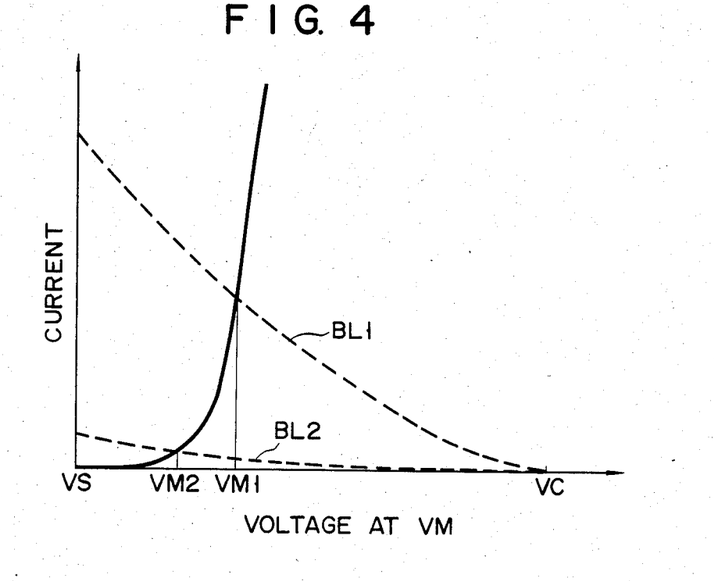
FIG. 4 is a graph of the voltage-current characteristics, illustrating the operation of the semiconductor device shown in FIG. 3.

The constant voltage drop circuit 12 is constructed to have such a large current drive capability as to allow the flow of a maximum operating current in the MOS operation circuit 10. When the maximum operating current flows in the circuit 10, the potential at that output terminal VM is set at the maximum level VM1. As can be seen from the foregoing, the MOS circuit 10 is operated, in any mode, on a voltage equal to the difference between the power source voltage VC and a voltage within the range from VM1 to VM2. Therefore, the MOS operation circuit 10 can be operated optimumly at all times.

Figure 5:
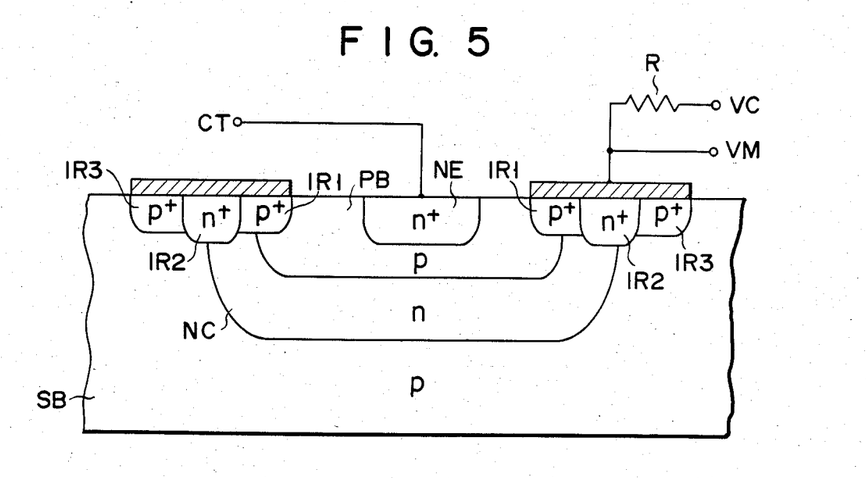
FIG. 5 illustrates an exemplary structure of a diode which can be used in the semiconductor shown in FIG. 3.

In FIG. 5, there is illustrated the structure of a transistor used as the diode D1 shown in FIG. 3. This transistor includes an n-type collector region NC in the p-type substrate SB, a p-type base region PB formed in the collector region NC, and an n+-type emitter region formed in the base region PB. Further, p+-, n+-, and p+-type impurity regions IR1 to IR3 are respectively formed in the surface areas of the base region PB, the collector region NC, and the substrate SB. The n+-type emitter region NE of this MOS transistor is coupled with a cathode terminal CT. The impurity regions are connected together to the output terminal VM, and to the power source terminal VC via a resistor R equivalent to the transistor Q1. In the diode thus constructed, the p-channel base region PB is surrounded by the n-type collector region NC. Therefore, electrons injected into the n+-type emitter region NE through the cathode terminal CT are completely collected by the n-type collector region NC. As a result, no minority carriers drift in the substrate SB, and hence the latch up phenomenon never occurs.

Figures 6, 7:
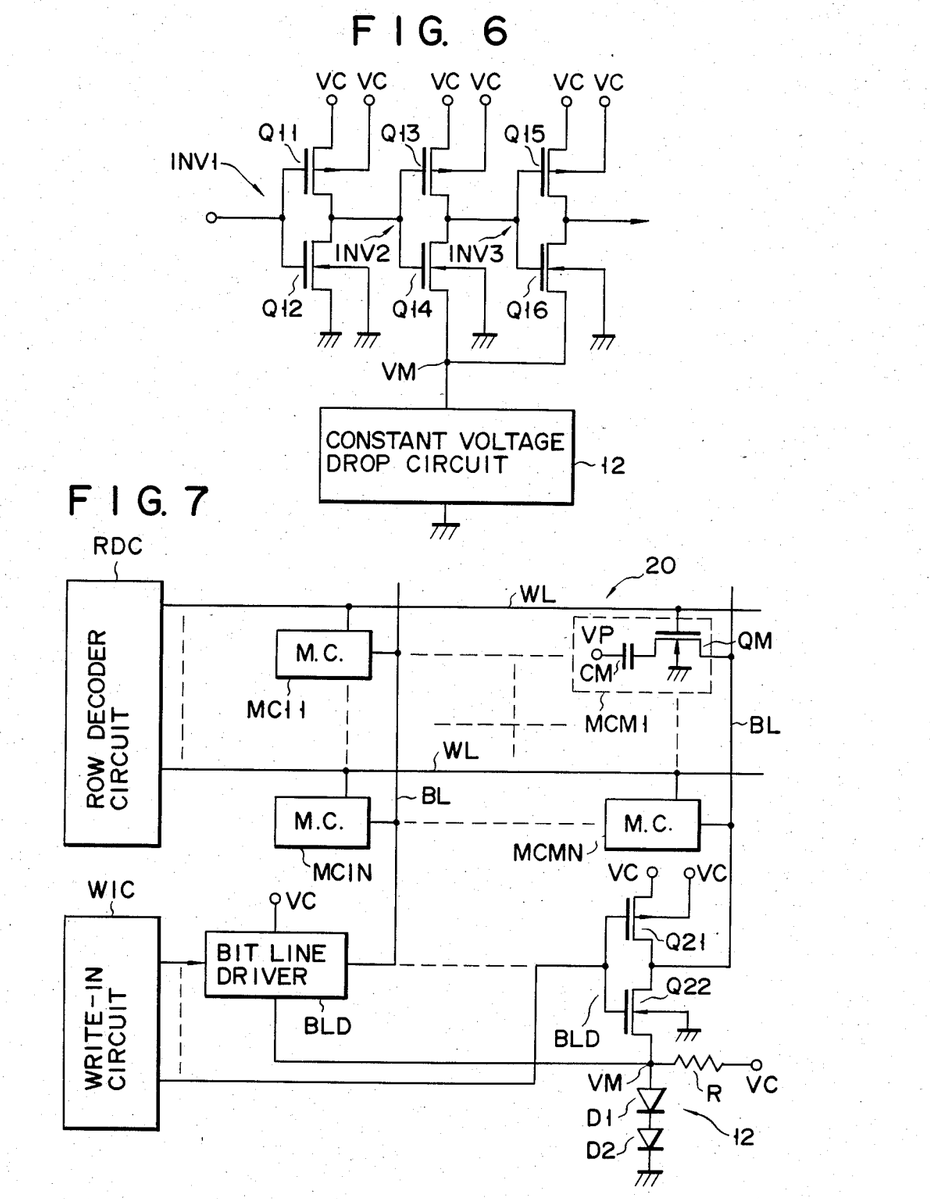
FIG. 6 is another circuit diagram of the MOS semiconductor device of FIG. 2.
FIG. 7 is a circuit diagram of a memory-equipped MOS semiconductor device as an MOS circuit.

FIG. 6 shows an MOS semiconductor device according to another embodiment of the present invention. This device includes a plurality of cascade-conneced inverter circuits INV1 to INV3. The inverter circuit INV1 constituting the first stage of the device includes MOS transistors Q11 and Q12 whose current paths are connected in series between the power source terminals VC and VS. The inverter INV2 includes a pair of transistors Q13 and Q14 whose current paths are connected in series between the power source terminal VC and the output terminal VM of the constant voltage drop circuit 12. The inverter INV3 likewise includes a pair of transistors Q15 and Q16 whose current paths are connected in series between the power source terminal VC and the output terminal of the circuit 12. The p-channel MOS transistors Q11, Q13 and Q15 are connected at the back gates to the power source terminal VC, and the back gates of the n-channel MOS transistors Q12, Q14, and Q16 are grounded.

The inverter INV1 of the first stage to driven by the power source voltage VC of 5.5 V, for example, to detect the input signal at a high sensitivity. This inverter INV1 is not influenced by a variation in the output voltage of the constant voltage drop circuit 12. In the inverter INV1, to improve the voltage withstand capability of the transistors Q11 and Q12, these transistors are geometrically designed to have a channel length of 1.5 μm, for example. The channel length of the remaining transistors Q13 to Q16 is set at 10 μm, for example. Since the area of the inverter INV1 is extremely small in contrast to the entire chip area, the relatively long channel length of the transistors Q11 and Q12 will not deteriorate the integration density of the semiconductor circuit.

FIG. 7 shows an MOS semiconductor device having a memory cell array 20 as the MOS operation circuit 10. This array has a plurality of memory cells MC11 to MCMN arranged in a matrix form. Each memory cell includes an n-channel MOS transistor QM with a channel length of 1 μm and a capacitor CM. The gates of the MOS transistors of the memory cells arranged on the same row are coupled with a corresponding word line WL. One end of the current path of each of the MOS transistors in the memory cells on the same column is coupled with a corresponding bit line BL. A power terminal VP is connected to one end of the capacitor in each memory cell. The word lines WL are coupled with a row decoder circuit RDC including word line drivers. The bit lines BL are coupled with bit line drivers BLD for selectively energizing the bit line according to a write-in signal derived from a write-in circuit WIC.

Each bit line driver BLD is comprised of MOS transistors Q21 and Q22 each having a channel length of 1 μm. The current paths of the MOS transistors are connected in series between the power source terminal VC and the output terminal VM of the constant voltage drop circuit 12. In this MOS semiconductor device, the potential on each bit line BL or at the other end of the current path of the MOS transistor in each memory cell is kept at the VM level or higher. Accordingly, the potential on the bit line BL is always kept at a higher potential level than the substrate potential, thereby continuously applying a reverse bias voltage between the substrate and the drain or source region.

In the circuit arrangement of the memory cell, when the voltage VP at one end of the capacitor CM varies, the potential at the other end of the capacitor also varies correspondingly. For example, when the voltage VP sharply changes in the negative direction due to noise, the potential at the other end of the capacitor CM drops to a voltage below the signal voltage written into this memory cell. As a result, a forward bias voltage may be applied across a pn junction, which is formed between one of the drain and source regions of the cell transistor and the substrate set at the VS level. In the MOS semiconductor circuit shown in FIG. 7, the potential at the other end of the memory capacitor CM is always kept at the VM level or higher, as mentioned above. Therefore, if the power source voltage VP varies, such a forward bias voltage will not be applied to the pn junction of the memory cell MC.

Figure 8:
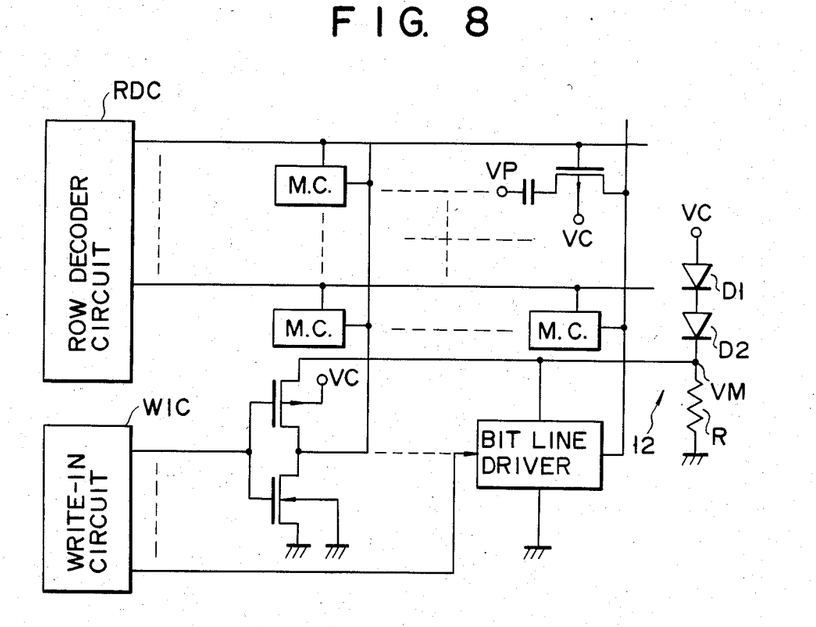
FIG. 8 shows an MOS semiconductor circuit according to another embodiment of the present invention.

FIG. 8 shows an MOS semiconductor device according to another embodiment of the present invention. The circuit arrangement of the semiconductor device of this embodiment is substantially the same as that of FIG. 7, except that each memory cell contains a p-channel MOS transistor and that the bit line drivers BLD are placed between ground and the output terminal VM of the constant voltage drop circuit 12. Further, in this case, the constant voltage drop circuit 12 has diodes D1 and D2 connected between the power source terminal VC and an output terminal VM and a reistor R connected between the output terminal VM and the ground. In this device, the potential level representing a logical "1" of the output signal from each bit line driver is set at a lower value. Accordingly, the voltage applied between the source and drain of the n-channel MOS transistor constituting the bit line driver BLD, is low. Therefore, the n-channel MOS transistor will not operate erroneously. In this case, it is possible to write into the memory cell a voltage approximately equal to the potential on the bit line without making the potential on the word line WL higher than the VC level by using a bootstrap circuit.

Figure 9:
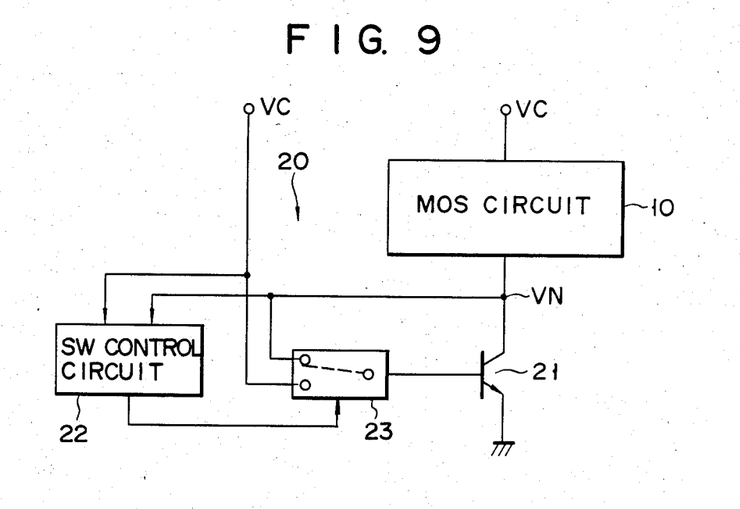
FIG. 9 shows a circuit diagram of an MOS semiconductor device according to still another embodiment of the present invention.

FIG. 9 shows an MOS semiconductor device according to a further embodiment of the present invention. The semiconductor device is comprised of an MOS circuit 10 and a power source circuit 20 which set the operating voltage of the MOS circuit 10. The MOS circuit 10 is connected at the high voltage receiving terminal to the external power source terminal VC and at the low voltage receiving terminal to the output terminal VN of the power source circuit 20. The power source circuit 20 includes an npn transistor 21, a switch control circuit 22, and a switching circuit 23. The transistor 21 is connected at the collector to the output terminal VN, and at the emitter to ground. The switch control circuit 22 produces a first or second output signal depending on whether a different voltage between the power source voltage VC and the output voltage VN, i.e. (VC-VN), is higher or lower than the reference voltage VR. The switching circuit 23 selectively connects the base of the transistor 21 to the terminal VN or VC according to the first or second output signal.

Figure 10:
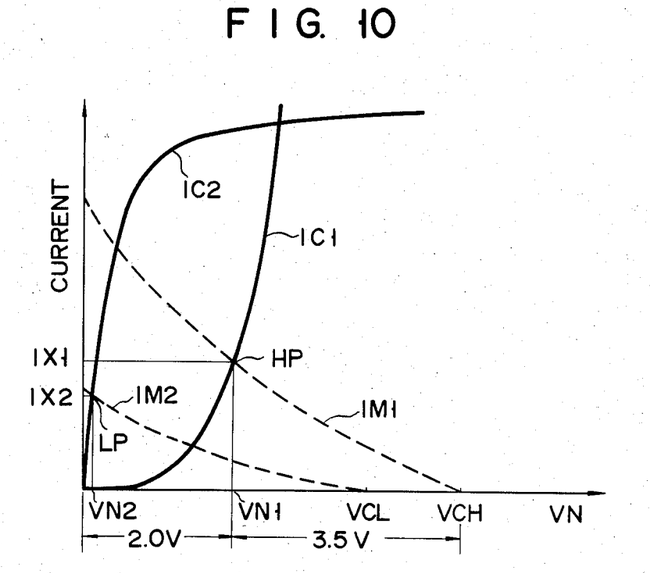
FIG. 10 shows a graph helpful in explaining the operation of the semiconductor device shown in FIG. 9.

FIG. 10 shows a voltage-current characteristic which illustrates the relationship between the output voltage VN and the operating current in the MOS circuit 10 and the power source circuit 20. The curves IC1 and IC2 each show the relationship between the collector current of the transistor 21 and the output voltage VN when a high voltage VCH, e.g. 5.5 V, or a low voltage VCL, e.g. 3.0 V, is applied to the external power source terminal VC. The curves IM1 and IM2 each represent the relationship between the operation current in the MOS circuit 10 and the output voltage VN when the high or low voltage VCH and VCL is applied to the power source terminal VC.

Assuming that the reference voltage VR is set at 3.0 V, when the high voltage VCH (=5.5 V) applied to the terminal VC is higher than the reference voltage VR, the base the transistor 21 is connected to the collector of the transistor 21 by way of the switching circuit 23. Under this condition, the transistor 21 operates in a nonsaturated manner, as indicated by the curve IC1. When the output voltage VN is VN1 (=2.5 V), the curve IC1 crosses the curve IM1 at a point HP where the operating current is IX1. At this cross point HP, the operation of the semiconductor device is stable. At this stable point, a low operating voltage of 3.5 V (=VCH-VN1) is applied to the MOS circuit 10. Thus, even if the high voltage VCH is applied to the power source terminal VC, the MOS circuit 10 including a number of transistors having channel length of 1 μm can be operated appropriately.

When a low voltage VCL of 3.0 V, for example, is applied to the terminal VC, the base of the transistor 21 is coupled with the terminal VC through the switching circuit 23. The transistor 21 operates along the saturated curve IC2. Under this condition, if the output voltage VN reaches VN2 (approximately 0 V), the curve IC2 crosses the curve IM2 at a point LP where the operation current is IX2. At this point, the semiconductor device operates stably. Also in this case, a low operating voltage of about 3 V (=VCL-VN2) is applied to the MOS circuit 10.

Figure 11:
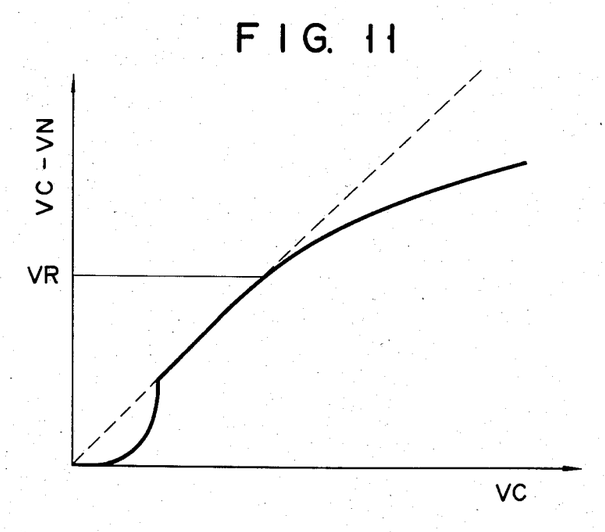
FIG. 11 shows a graph illustrating the relationship between the power source voltage and the operating voltage in the semiconductor device shown in FIG. 9.

As shown in FIG. 11 a voltage difference (VC-VN) between the output voltage VN and the power source voltage VC obtained when the circuit is in a stable condition varies according to a variation of the power source voltage VC. When the operating voltage (VC-VN) is lower than the reference voltage VR, the operating voltage increases at a rate of change approximately equal to that of the power source voltage VC. When it exceeds the reference voltage VR, the rate of change of the operating voltage is smaller than that of the power source voltage VC. This fact indicates that an optimum operating voltage can always be applied to the MOS circuit 10 irrespective of any variation of the power source voltage VC.

Figure 12:
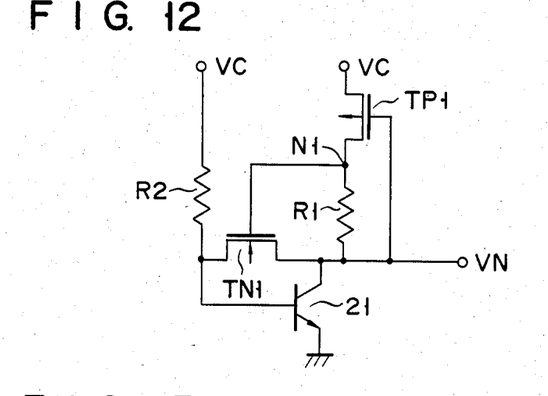
FIGS. 12 and 13 show circuit diagrams of the power source circuit shown in FIG. 9.

FIG. 12 shows a circuit diagram of the the power source circuit 20 shown in FIG. 9. This circuit 20 includes an n-channel MOS transistor TN1 and a p-channel MOS transistors TP1. The transistor TN1 is connected between the base and collector of the transistor 21. The transistor TP1 is connected at one end to the power source terminal VC and at the other end to the collector of the transistor 21 via a resistor R1. The base of the transistor 21 is coupled with the power source terminal VC through a resistor R2, and the collector is connected to the output terminal VN. In this circuit arrangement, the resistor R2 and the transistor TN1 constitute the switching circuit 23, and the resistor R1 and the transistor TP1 form the control circuit 22.

In the power source circuit thus arranged, when the power source voltage VC is high, and the voltage difference (VC-VN) is above a predetermined value, the transistor TP1 is turned on. The potential at the node N1 between the transistor TP1 and the resistor R1 is set substantially equal to the power source voltage VC. The potential at the node N1 causes the transistor TN1 to turn on. The output terminal VN and the base of the transistor 21 are substantially short circuited. The output terminal VN feeds most of the current to the base of the transistor 21. As a result, the collector potential of the transistor 21 is set equal to or higher than the base potential, to thereby raise the output voltage VN. As a result, the operating voltage (VC-VN1) of the MOS operation circuit 20 is set to a lower voltage.

When the power source voltage VC is low and the voltage difference (VC-VN) is below a predetermined voltage, the MOS transistor TP1 is turned on and the potential at the node N1 is substantially equal to the VN potential. This causes the MOS transistor TN1 to be turned off, so that the base current to the transistor 21 is fed from the power source terminal VC through the resistor R2. The resistance of the resistor R2 is given such a value that a sufficiently large base current is supplied to the transistor 21 to allow the transistor 21 to operate in the saturated region when the voltage difference (VC-VN) is equal to the predetermined voltage VR and the operating current in the MOS circuit 10 is fed to the collector of the transistor 21.

Figure 13:
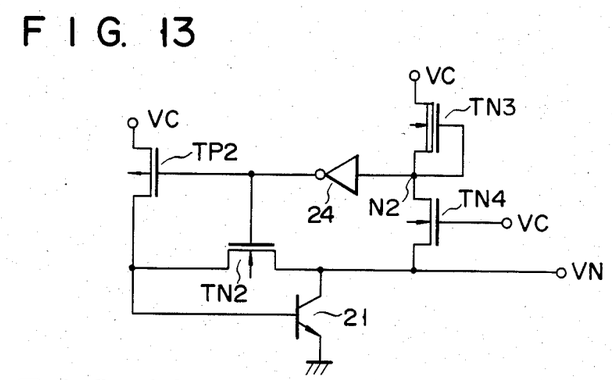

FIG. 13 shows another example of the power source circuit 20 in FIG. 9. This circuit 20 includes an enhancement type n-channel MOS transistor TN2, an enhancement type p-channel MOS transistor TP2, a depletion type n-channel MOS transistor TN3, an enhancement type n-channel MOS transistor TN4, an inverter 24, and an npn transistor 21. The MOS transistor TN2 is connected between the base and collector of the transistor 21 whose emitter is grounded. The MOS transistor TP2 is connected between the power source terminal VC and the base of the transistor 21. The MOS transistor TN3 is connected at one end to the terminal VC and at the other end to the collector of the transistor 21 through the MOS transistor TN4. The inverter 24 is connected at the input terminal to the node N2 between the MOS transistors TN3 and TN4, and at the output terminal to the gates of the MOS transistors TN2 and TP2. The MOS transistors TP2 and TN2 constitute the switching circuit 23. The transistors TN3 and TN4, and the inverter 24 form the control circuit 22.

In this circuit arrangement, when the voltage difference (VC-VN) is above the predetermined voltage VR, the MOS transistor TN4 is turned on. The potential at the node N2 is substantially equal to the VN potential. The inverter 24 produces a voltage nearly equal to the VC potential. The output voltage of the inverter 24 renders the transistor TN2 conductive and the transistor TP2 nonconductive. Then, the base current is fed to the transistor 21 through the transistor TN2 so that the transistor 21 operates in the unsaturated region.

When the voltage difference (VC-VN) is below the predetermined voltage VR, the conductance of the MOS transistor TN4 is smaller than that of the MOS transistor TN3, and the potential at the node N2 is substantially equal to the VC potential. The inverter 24 produces a low voltage signal approximately equal to the VN level. This causes the MOS transistors TP2 and TN2 to be made conductive and nonconductive, respectively. Incidentally, the MOS transistor TP2 is so designed as to have such a conductance that the base current to the transistor 21 is large enough to operate the transistor 21 in the saturated region. As a result of the operation of the transistor 21, the output voltage VN is set approximately equal to the ground level VS, so that an external power source voltage lower than the predetermined voltage VR is supplied as an operation voltage to the MOS circuit 10.

Figure 14:
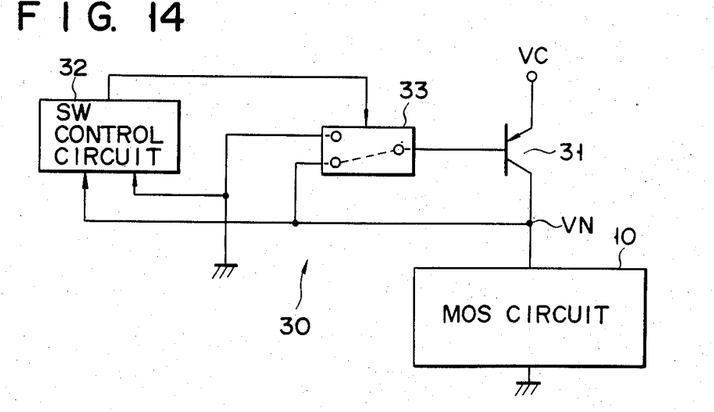
FIG. 14 is a circuit diagram of an MOS semiconductor device according to another embodiment of the present invention.

The power source circuit 20 in the circuit of FIG. 9 may be replaced by a power source circuit 30 shown in FIG. 14. In this case, the circuit 30 is inserted between the high voltage receiving terminal of the MOS circuit 10 and the external power source terminal VC. The power source circuit 30 comprises a pnp transistor 31, a switch control circuit 32 and a switching circuit 23. The transistor 31 is connected at the emitter to the power source terminal VC and at the collector to the output terminal VN. The control circuit 31 produces a signal, which indicates whether the voltage difference (VN-VS) between the output voltage VN and the ground potential VS is higher or lower than the reference voltage VR. The switching circuit 23 selectively connects the base of the transistor 31 to the output terminal VN or ground in response to the signal output from the control circuit 32.

In the power source circuit 30, when the voltage difference (VN-VS) is higher than the reference voltage VR, the base of the transistor 31 is connected to its collector through the switching circuit 33, to increase the voltage drop across the transistor 31. Finally, the potential at the output terminal VN drops. When the voltage difference (VN-VS) drops below the reference voltage VR, the base of the transistor 21 is grounded to minimize the voltage drop across the transistor 21.

While the present invention has been described using a number of specific embodiments, it should be understood that the present invention is not limited to such embodiments. For example, in the MOS circuit 10, the MOS transistor Q1 may be omitted if a sufficiently large leak current flows through the circuit 10 and the diodes D1 and D2 to cause a constant voltage at the output terminal VM when the circuit 10 is set in the standby mode.

What is claimed is:

1. An MOS semiconductor device comprising:
    first and second power source terminals connected to receive a power source voltage and a reference voltage, respectively;
    an MOS circuit including a plurality of MOS transistor whose back gates are coupled with said first or second power source terminal, and having first and second operation voltage receiving terminals, one of said first and second operation voltage receiving terminals being coupled with the one of said first and second power source terminals not coupled with said back gates; and
    an operation voltage setting circuit having voltage-drop means coupled between said second power source terminal and the one of the first and second operation voltage receivig terminals of said MOS circuit not coupled with said back gates for developing a voltage drop across said voltage-drop means in accordance with an operation current flowing through said MOS circuit and said voltage-drop means, and applying to said MOS circuit a voltage corresponding to a difference between the voltage drop across said voltage-drop means and said power source voltage.

2. An MOS semiconductor device according to claim 1, wherein said voltage-drop means of said operation voltage setting circuit includes at least one diode connected between said second power source terminal and said MOS circuit.

3. An MOS semiconductor device according to claim 2, wherein said operation voltage setting circuit includes resistive means connected between said first power source terminal and said at least one diode.

4. An MOS semiconductor device according to claim 1, wherein said voltage-drop means of said operation voltage setting circuit includes at least one bipolar transistor having a base and collector connected to each other, said bipolar transistor being connected between said second power source terminal and said MOS circuit.

5. An MOS semiconductor device according to claim 4, wherein said operation voltage setting circuit includes resistive means connected between said first power source terminal and said at least one transistor.

6. An MOS semiconductor device according to claim 1, wherein said MOS circuit includes a plurality of memory cells arranged in a matrix form, each of said memory cells including at least one MOS transistor with an effective channel length of 1 $\mu$m or less, a plurality of bit lines each connected to the memory cells on a corresponding column, and a plurality of bit line drivers driven by an operating voltage set by said operation voltage setting circuit.

7. An MOS semiconductor device according to claim 1, wherein said MOS circuit includes an input buffer containing a plurality of MOS transistors and driven by said power source voltage, and a logic circuit containing a plurality of MOS transistors each with the channel length shorter than that of the MOS transistors of said input buffer, said logic circuit being driven by the operation voltage set by said operation voltage setting circuit to thereby produce a logic signal in response to the output signal from said input buffer.

8. An MOS semiconductor device according to claim 1, wherein said voltage-drop means of said operation voltage setting circuit includes a bipolar transistor having a current path connected between one of said first and second power source terminals and said MOS circuit, and said operation voltage setting circuit further includes switching means for coupling a base of said bipolar transistor with a selected one of said first or second operation voltage receiving terminals of said MOS circuit selected according to the relationship of the operation voltage supplied to said MOS circuit and a predetermined voltage.

9. An MOS semiconductor device according to claim 8, wherein said switching means includes a switching circuit for coupling the base of said bipolar transistor to said first and second operating voltage receiving terminals of said MOS circuit respectively at first and second switching positions, and a control circuit for setting said switching circuit to first and second switching positions respectively when the operation voltage supplied to said MOS circuit is higher and lower than said predetermined voltage.

10. An MOS semiconductor device according to claim 8, wherein said switching means includes first resistive means connected at one end to said first power source terminal and at the other end to the base of said bipolar transistor, an n-channel MOS transistor whose current path is connected at one end to the other end of said first resistive means and at the other end to the collector of said bipolar transistor and the second operation voltage receiving terminal of said MOS circuit, second resistive means connected at one end to the gate of said n-channel MOS transistor and at the other end to the other end of the current path of said n-channel MOS transistor, and a p-channel MOS transistor having a gate conected to the second operation voltage receiving terminal of said MOS circuit and a current path connected between said first power source terminal and the other end of said second resistive means.

11. An MOS semiconductor device according to claim 8, wherein said bipolar transistor is an npn transistor which has an emitter connected to said second power source terminal and has a collector connected to said second operation voltage receiving terminal.
    wherein said switching means includes
        a p-channel MOS transistor having a current path connected between said first power source terminal and the base of said npn transistor,
        a first n-channel MOS transistor having a current path connected between the base and collector of said npn transistor,
        second and third n-channel MOS transistors having current paths connected in series between said first power source terminal and said second operation voltage receiving terminal, said second n-channel MOS transistor having a gate connected to a junction between said second and third MOS transistors, and said third n-channel MOS transistors having a gate connected to said first power source terminal, and
        an inverter having an input terminal connected to a junction between said second and third n-channel MOS transistors and having an output terminal connected to the gates of said first p-channel MOS transistor and said first n-channel MOS transistor.

12. An MOS semiconductor device according to claim 1, wherein said MOS transistors are of n-channel type, the back gates of said MOS transistors are connected to said second power source terminal, said voltage-drop means is connected between the said second voltage receiving terminal of said MOS circuit and said second power source terminal, and said operation voltage setting circuit further includes resistive means connected between said first power source terminal and the second voltage receiving terminal of said MOS circuit.

* * * * *